US008299605B2

(12) United States Patent
Basker et al.

(10) Patent No.: US 8,299,605 B2
(45) Date of Patent: Oct. 30, 2012

(54) CARBON NANOTUBE STRUCTURES FOR ENHANCEMENT OF THERMAL DISSIPATION FROM SEMICONDUCTOR MODULES

(75) Inventors: Veeraraghavan S Basker, Albany, NY (US); Toshiharu Furukawa, Essex Junction, VT (US); Mark C Hakey, Fairfax, VT (US); Steven J Holmes, Guilderland, NY (US); Charles W Koburger, III, Delmar, NY (US); Krishna V Singh, Hillsboro, OR (US)

(73) Assignee: International Business Machines Corporation, Armonk, NY (US)

( * ) Notice: Subject to any disclaimer, the term of this patent is extended or adjusted under 35 U.S.C. 154(b) by 975 days.

(21) Appl. No.: 11/939,599

(22) Filed: Nov. 14, 2007

(65) Prior Publication Data

US 2009/0121343 A1 May 14, 2009

(51) Int. Cl.
*H01L 23/34* (2006.01)
(52) U.S. Cl. ................ 257/706; 257/E23.101
(58) Field of Classification Search .......... 257/706–707, 257/720, 722, E23.101, E23.105
See application file for complete search history.

(56) References Cited

U.S. PATENT DOCUMENTS

| 5,424,245 | A | * | 6/1995 | Gurtler et al. ............. 438/107 |
| 6,984,579 | B2 | * | 1/2006 | Nguyen et al. ............. 438/622 |
| 7,086,451 | B2 | | 8/2006 | Leu et al. |
| 7,494,910 | B2 | * | 2/2009 | Mouli et al. ............... 438/599 |
| 2006/0091557 | A1 | * | 5/2006 | Sakamoto et al. ......... 257/774 |
| 2007/0114658 | A1 | | 5/2007 | Dangelo et al. |
| 2007/0126116 | A1 | | 6/2007 | Dangelo et al. |
| 2007/0155136 | A1 | | 7/2007 | Chrysler et al. |
| 2007/0158584 | A1 | | 7/2007 | Lin |
| 2008/0283959 | A1 | * | 11/2008 | Chen et al. ............... 257/508 |

OTHER PUBLICATIONS

Quirk et al (Semiconducting Manufacturing Technology, 2001 Prentice Hall, p. 538).*

* cited by examiner

*Primary Examiner* — Kiesha Bryant
*Assistant Examiner* — Ali Naraghi
(74) *Attorney, Agent, or Firm* — Gibb & Riley, LLC; Joseph Petrokaitis, Esq.

(57) ABSTRACT

Disclosed are embodiments of an improved semiconductor wafer structure having protected clusters of carbon nanotubes (CNTs) on the back surface and a method of forming the improved semiconductor wafer structure. Also disclosed are embodiments of a semiconductor module with exposed CNTs on the back surface for providing enhanced thermal dissipation in conjunction with a heat sink and a method of forming the semiconductor module using the disclosed semiconductor wafer structure.

19 Claims, 12 Drawing Sheets

CARBON NANOTUBE STRUCTURES FOR ENHANCEMENT OF THERMAL DISSIPATION FROM SEMICONDUCTOR MODULES

BACKGROUND

1. Field of the Invention

The embodiments of the invention generally relate to enhanced of thermal dissipation from semiconductor modules, and, more particularly, to the use of carbon nanotube (CNT) structures to provide enhancement of thermal dissipation from semiconductor modules.

2. Description of the Related Art

Integrated circuit chips (i.e., semiconductor modules) generate substantial amounts of heat during normal operation. In order to optimize chip performance and/or avoid outright chip failure, due to thermal overload, this heat needs to be dissipated away from a chip (i.e., the chips need to be cooled). Heat dissipation is typically accomplished by means of a heat sink attached to the back side of the chip (i.e., to the chip surface opposite to any devices). The bottleneck for thermal dissipation occurs at the interface between the chip and this heat sink. A fan can be used to enhance thermal dissipation by drawing heat away from the heat sink.

Other known techniques can also be used to enhance thermal dissipation by providing a better conductive interface between the chip and heat sink. For example, thermally conductive grease (e.g., a conductive ceramic loaded into a hydrocarbon paste) can be used to provide a bonding interface between the chip and the heat sink. Alternatively, carbon nanotubes (CNTs) have been formed on the back side of the chip and/or on a heat sink surface such that, when the heat sink is in place, they allow heat to be conducted from the chip to the heat sink. Such CNT structures have been shown to provide superior thermal dissipation relative to that provided by thermal grease (see International Jour. Heat and Mass Transfer, v. 49 (2006), p 1658). However, the techniques used to form such CNT structures are not very efficient.

SUMMARY

Disclosed herein are embodiments of an improved semiconductor wafer structure and a method of forming the semiconductor wafer structure. The improved semiconductor wafer structure comprises a semiconductor wafer with a back side and a front side opposite the back side. The semiconductor wafer is configured so that semiconductor devices can be formed on the front side. The semiconductor wafer is further configured with a plurality of protected clusters of CNTs on the back side.

A method of forming the semiconductor wafer structure, as described above, comprises first providing a semiconductor wafer, having a back side and a front side opposite the back side. Then, a plurality of protected clusters of carbon nanotubes (CNTs) are formed on the back side of the semiconductor wafer. After the clusters of CNTs are formed on the back side of the wafer, heat sensitive materials are formed on the front side of the wafer. Thus, the heat sensitive materials on the front side of the wafer are not affected by the processes used to form the CNTs on the back side of the wafer.

Also disclosed are embodiments of a semiconductor module that is formed using the above described semiconductor wafer and a method of forming this semiconductor module. The semiconductor module can comprise a chip, having a back side and a front side opposite the back side. The semiconductor module can further comprise at least one semiconductor device on the front side of the chip. On the back side of the chip, either in the chip substrate itself or on a spacer layer adjacent to the chip substrate, the semiconductor module can comprise a plurality of trenches and a plurality of clusters of carbon nanotubes (CNTs) within those trenches. That is, one cluster of CNTs can be positioned within each one of the trenches.

A method of forming the semiconductor module, as described above, comprises providing the semiconductor wafer, as described above, having a back side with a plurality of protected clusters of carbon nanotubes (CNTs). Specifically, the clusters of CNTs are positioned within trenches in the back side of the semiconductor wafer itself or within trenches in a spacer layer on the back side of the semiconductor wafer. The clusters of CNTs are also protected by a protective cap layer over the trenches. Next, semiconductor devices are formed on the front side of the semiconductor wafer. Then, the wafer is diced into chips such that each chip retains at least one cluster of CNTs. Once the wafer is diced into chips, the protective cap layer is removed from the chips. Finally, a heat sink is attached to each chip such that the carbon nanotube (CNT) clusters on the back side of the chip are in contact with the heat sink.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of these embodiments without departing from the spirit thereof, and these embodiments include all such changes and modifications.

BRIEF DESCRIPTION OF THE DRAWINGS

The embodiments of the invention will be better understood from the following detailed description with reference to the drawings, in which.

DETAILED DESCRIPTION OF THE EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, integrated circuit chips (i.e., semiconductor modules) generate substantial amounts of heat during normal operation. In order optimize chip performance and/or avoid outright chip failure due to thermal overload, this heat needs to be dissipated away from a chip (i.e., the chips need to be cooled). Heat dissipation is typically accomplished by means of a heat sink attached to the back side of the chip (i.e., to the chip surface opposite any devices). The key limitation for thermal dissipation occurs at the interface between the chip and this heat sink. A fan can be used to enhance thermal dissipation by drawing heat away from the heat sink.

Other known techniques can also be used to enhance thermal dissipation by providing a better conductive interface between the chip and heat sink. For example, thermally conductive grease (e.g., a conductive ceramic loaded into a hydrocarbon paste) can be used to provide a bonding interface between the chip and the heat sink. Alternatively, carbon nanotubes (CNTs) have been formed on the back side of the chip and/or on a heat sink surface such that, when the heat sink is in place, they allow heat to be conducted from the chip to the heat sink. Although such nanotube (CNT) structures have been shown to provide superior thermal dissipation relative to that provided by thermal grease (see International Jour. Heat and Mass Transfer, v. 49 (2006), p 1658), there is a significant problem with this approach. That is, because CNTs would be destroyed during semiconductor wafer processing, they must be grown on the back of the chip after chip metallization is complete. However, because the growth temperature for CNTs is between 600-800° C., wiring structures in the chip metallization layers inevitable are destroyed. Therefore, it would, however, be advantageous over the prior art to provide an improved structure and method that incorporates such CNTs to enhance thermal dissipation without damaging the on-chip CNTs or the chip wiring structures.

In view of the foregoing, disclosed herein are embodiments of an improved semiconductor wafer structure having protected clusters of carbon nanotubes (CNTs) on the back surface and a method of forming the improved semiconductor wafer structure. Also disclosed are embodiments of a semiconductor module with exposed CNTs on the back surface for providing enhanced thermal dissipation in conjunction with a heat sink and a method of forming the semiconductor module using the disclosed semiconductor wafer structure.

Specifically, referring to FIGS. 1-4, disclosed herein are embodiments of an improved semiconductor wafer structure 100, 200. The improved semiconductor wafer structure 100, 200 comprises a semiconductor wafer 101, 201 (e.g., a bulk silicon wafer or silicon-on-insulator (SOI) wafer) with a back side 192, 292, and a front side 191, 291 opposite the back side. The semiconductor wafer 101, 201 is configured, as a conventional semiconductor wafer, so that semiconductor devices can be formed on the front side 191, 291. However, the semiconductor wafer 101, 201 is further configured with a plurality of protected clusters of carbon nanotubes (CNTs) 120, 220 on the back side 192, 292. The protected clusters of CNTs can be present over 1-99 percent of the back side 192, 292 of the semiconductor wafer 101, 102. Preferably, the protected clusters of CNTs are present over approximately 50-70 percent of the backside 192, 292 of the semiconductor wafer 101, 102.

Figure 1:
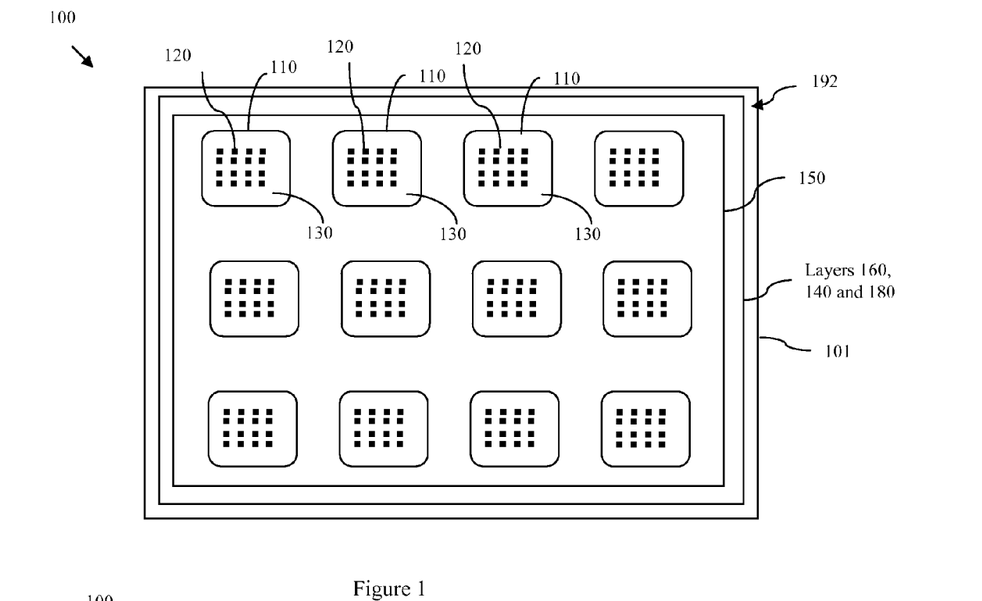
FIG. 1 is a top view diagram illustrating an embodiment of a semiconductor wafer of the present invention.
Figure 2:
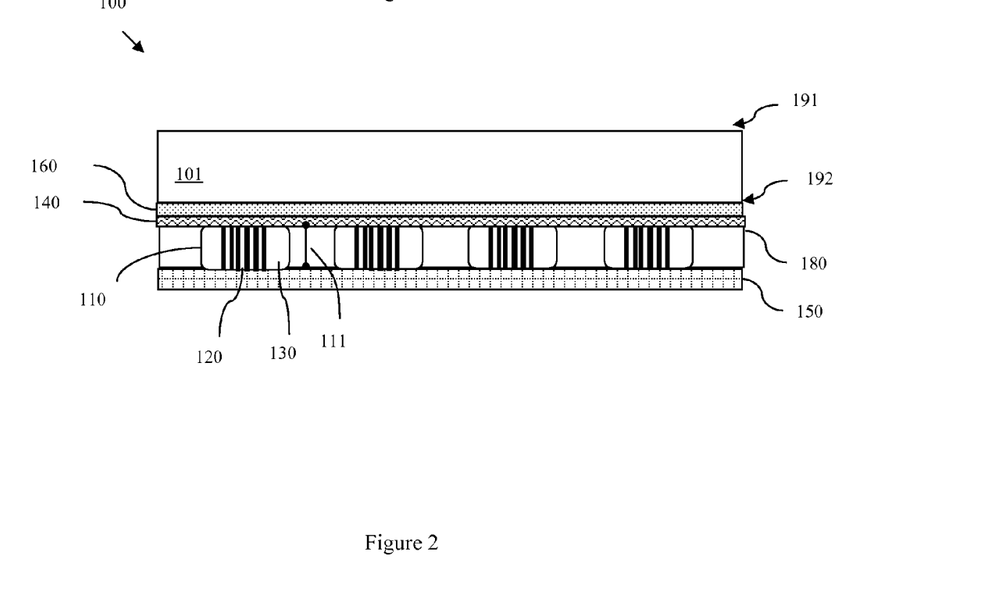
FIG. 2 is a cross-section diagram illustrating the semiconductor wafer of FIG. 1.

More specifically, FIGS. 1 and 2 are top view and cross section diagrams, respectively, of one embodiment of an improved semiconductor wafer structure 100. Referring to FIGS. 1 and 2 in combination, the semiconductor wafer structure 100 comprises a diffusion barrier layer 160 positioned on the back side 192 of the semiconductor wafer 101. The diffusion barrier layer 160 can, for example, comprise an approximately 50 nm nitride layer.

A blanket catalyst layer 140 can be positioned adjacent to the diffusion barrier layer 160. The blanket catalyst layer 140 can comprise, for example, an approximately 50 nm layer of cobalt (Co), nickel (Ni), iron (Fe) or any other suitable metal catalyst layer for growing CNTs.

A spacer layer 180 can be positioned adjacent to the catalyst layer 140. The spacer layer 180 can comprise a chemically and mechanically stable protective film (e.g., an approximately 100 nm silicon oxide ($SiO_2$) layer or polysilicon layer). The spacer layer 180 can be configured with a pattern of trenches 110, where each trench 110 extends through the spacer layer 180 to the catalyst layer 140 such that each trench comprises a through hole. The pattern of trenches 110 (including the size, shape and number of trenches) can be approximately uniform across the spacer layer 180. The pattern can, for example, comprise a "waffle" pattern in which the trenches 110 are square or rectangular in shape. Alternatively, the pattern can comprise an "egg-crate" pattern in which the trenches 110 are circular or oval in shape. The pattern can be laid out such that a predetermined percentage (e.g., approximately 50-70%) of the surface area of the catalyst layer 140 on the back side 192 of the wafer 101 is exposed. The pattern can further be laid out such that the trench 110 openings range from 0.5 to 10 microns in width and the trenches 110 are separated from each other by 0.5 to 10 micron spacer areas.

A protective cap layer 150 (i.e., a second dielectric layer) can be positioned adjacent to the spacer layer 180 such that each trench 110 is covered (i.e., capped). The protective cap layer 180 can comprise a chemically and mechanically stable protective film, e.g., a polysilicon layer or a nitride layer. For example, the protective cap layer 150 can comprise an approximately 100 nm silicon nitride ($Si_3N_4$) layer.

The protected clusters of CNTs 120 can be located within each of the trenches 110 on and, more specifically, grown from the exposed portion of catalyst layer 140. Thus, given the pattern of trenches 110, a predetermined percentage (e.g., approximately 50-60%) of the back side 192 of the semiconductor wafer 101 can be uniformly covered by the protected clusters of CNTs 110. The length 111 of these CNTs 120 can be approximately equal to the thickness of the spacer layer 180 and, thereby, can be approximately equal to the depth of the trenches 110 (e.g., approximately 100 nm).

Additionally, fill material 130 can be present within each trench 110 adjacent to (i.e., surrounding) the CNTs 120. The fill material 130 can comprise a heat-conductive material. For example, the fill material 130 can comprise polycrystalline silicon (polysilicon), tungsten (W), tantalum nitride (TaN), titanium nitride (TiN), copper, diamond like carbon (DLC), amorphous carbon or any other suitable heat conductive material.

The fill material 130, the trenches 110 in the spacer layer 180 and the protective cap layer 150 are designed to protect the clusters of CNTs 120, during subsequent semiconductor wafer processing. That is, the fill material 130, the trenches 110 in the spacer layer 180, and the protective cap layer 150 are designed to protect the CNTs 120 when semiconductor devices and/or metallization layers are subsequently formed on the front side 191 of the semiconductor wafer 101.

Figure 3:
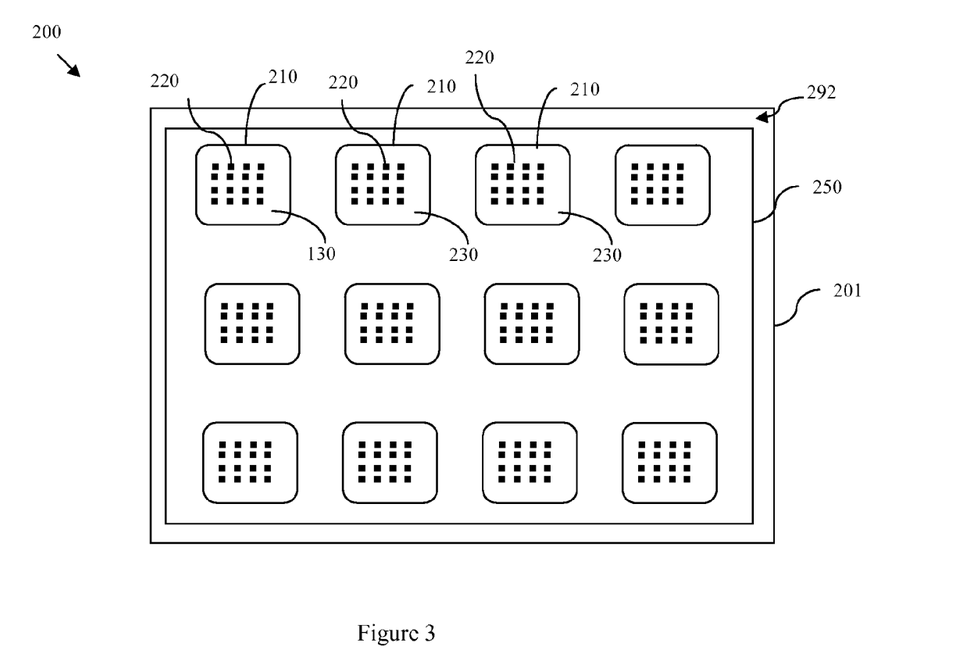
FIG. 3 is a top view diagram illustrating another embodiment of a semiconductor wafer of the present invention.
Figure 4:
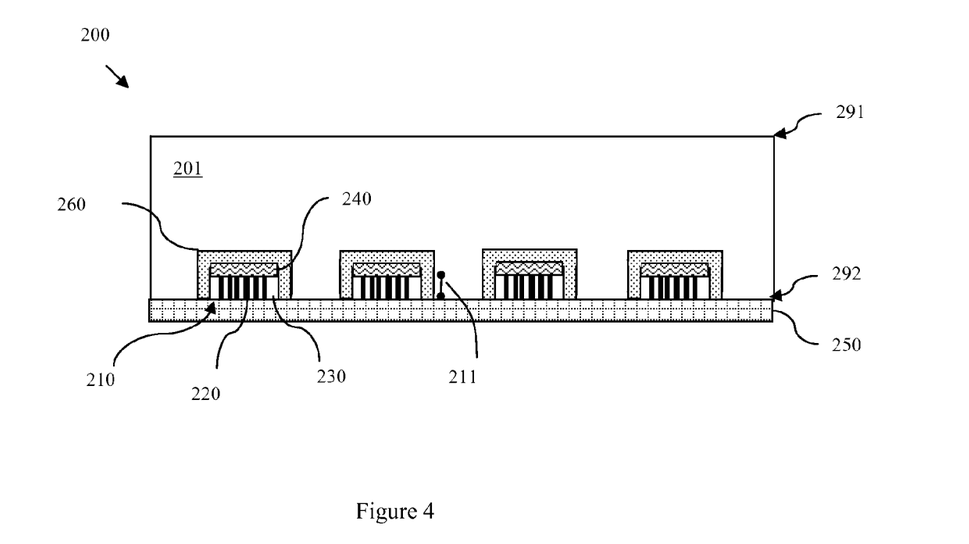
FIG. 4 is a cross-section diagram illustrating the semiconductor wafer of FIG. 3.

FIGS. 3 and 4 are top view and cross section diagrams, respectively, of another embodiment of an improved semiconductor wafer structure 200. Referring to FIGS. 3 and 4 in combination, the improved semiconductor wafer structure 200 comprises a pattern of trenches 210 in the back side 292 of the semiconductor wafer 201 itself. The pattern of trenches 210 (including the size, shape and number of trenches) can be approximately uniform across the back side 292 of the wafer 201. The pattern can, for example, comprise a "waffle" pattern in which the trenches 210 are square or rectangular in shape. Alternatively, the pattern can comprise an "egg-crate" pattern in which the trenches 210 are circular or oval in shape. The depth of the trenches 210 can range, for example, between 100 and 300 µm. Additionally, the pattern can be laid out such that a predetermined percentage (e.g., approximately 50-70%) of the back side 292 of the wafer 101 is trenched out. The pattern can further be laid out such that the trench 210 openings range from 0.5 to 10 microns in width and the trenches 210 are separated from each other by 0.5 to 10 microns of wafer substrate.

A diffusion barrier layer 260 (e.g., a thin nitride layer) can optionally line each trench 210 (i.e., can be positioned on the bottom surface and/or sidewalls of each trench 210). A thin catalyst layer 240 can be positioned adjacent to the diffusion barrier layer 260 at least at the bottom surface of each trench 210. The catalyst layer 240 can comprise, for example, cobalt (Co), nickel (Ni), iron (Fe) or any other suitable metal catalyst layer for growing CNTs.

A protective cap layer 250 can be positioned adjacent to the back side 292 of the wafer 201 such that each trench 210 is covered (i.e., capped). The protective cap layer 250 can comprise a chemically and mechanically stable protective film, e.g., polysilicon or silicon nitride ($Si_3N_4$).

The protected clusters of CNTs 220 can be located within each of the trenches 210 on and, more specifically, grown from the catalyst layer 240 within each trench 210. Thus, given the pattern of trenches 210, a predetermined percentage (e.g., approximately 50-70%) of the back side 292 of the semiconductor wafer 201 can be uniformly covered by the protected clusters of CNTs 220. The length 211 of the CNTs 220 can be approximately equal to the depth of the trenches 210, less the thicknesses of the barrier diffusion and catalyst layers 260, 240.

Additionally, fill material 230 can be present within each trench 210 adjacent to (i.e., surrounding) the CNTs 220. The fill material 230 can comprise a heat-conductive material. For example, the fill material 130 can comprise polysilicon, tungsten (W), tantalum nitride (TaN), titanium nitride (TiN), copper, diamond like carbon (DLC), amorphous carbon or any other suitable heat conductive material.

The fill material 230, the trenches 210 in the back side 292 of the wafer 201 and protective cap layer 250 are designed to protect the clusters of CNTs 220, during subsequent semiconductor wafer processing. That is, the fill material 230, the trench 210 in the back side 292 of the wafer 201 and the protective cap layer 250 are designed to protect the CNTs 220 when semiconductor devices and/or metallization layers are subsequently formed on the front side 291 of the semiconductor wafer 201.

Figure 5:
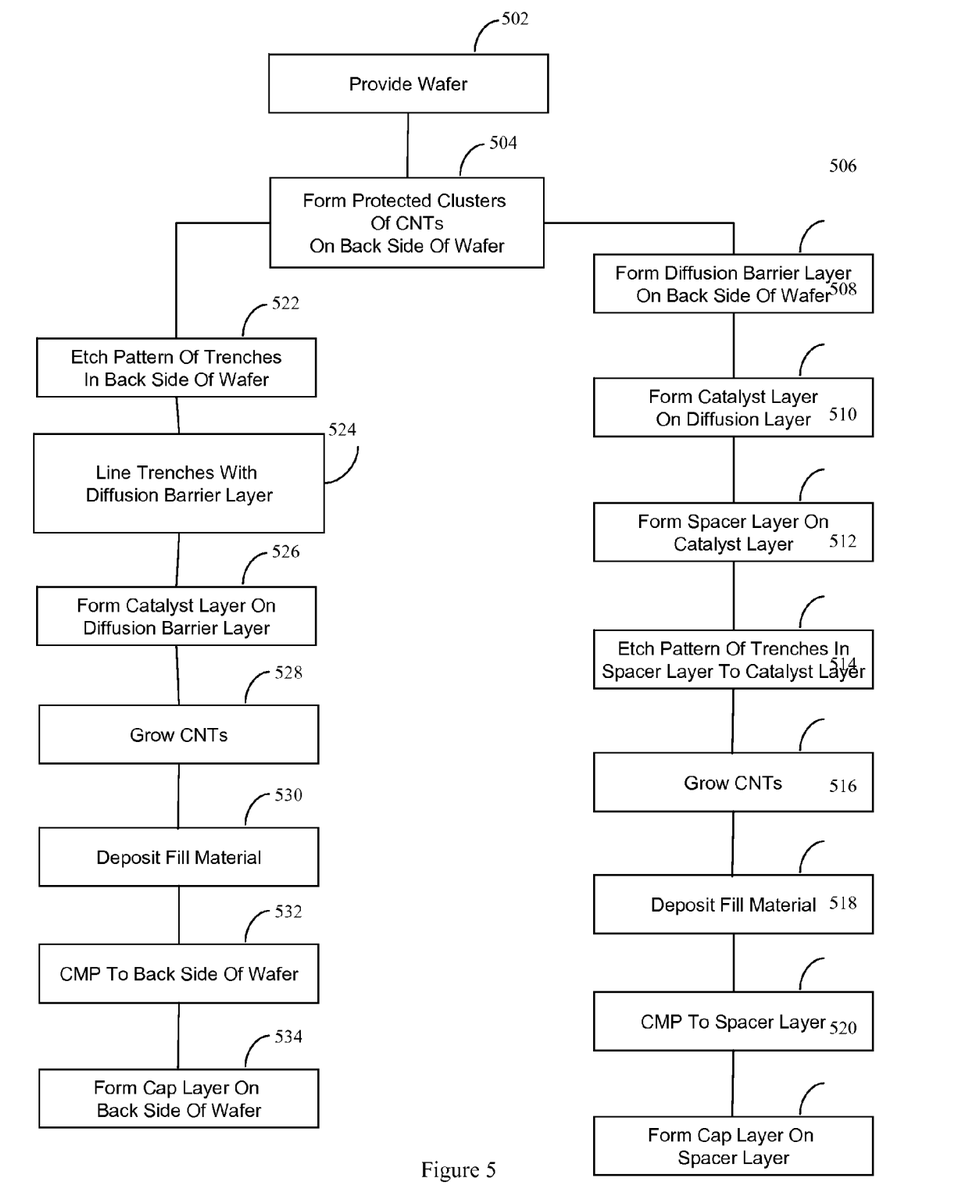
FIG. 5 is a flow diagram illustrating embodiments of a method of forming the semiconductor wafer embodiments of FIGS. 1-4.
Figure 6:
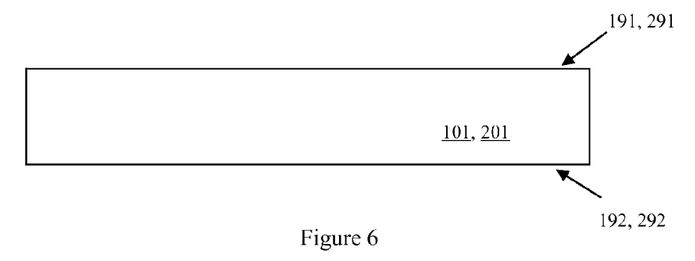
FIG. 6 is a cross-section diagram illustrating a partially completed semiconductor wafer structure 100 of FIGS. 1-2.

Referring to the flow diagram of FIG. 5, embodiments of a method of forming the improved semiconductor wafer structure 100, 200, as described above, comprise first providing semiconductor wafer 101, 201 (e.g., a bulk silicon or silicon-on-insulator (SOI) wafer), having a back side 192, 292 and a front side 191, 291 opposite the back side (502, see also FIG. 6). Then, prior to forming heat sensitive materials on the front side 191, 291 of the semiconductor wafer 101, 201, a plurality of protected clusters of carbon nanotubes (CNTs) are formed on the back side 192, 292 of the semiconductor wafer 101, 201 (504). For example, these protected clusters can be formed such that approximately 50-60 percent of the back side wafer surface is covered by CNTs.

As noted above, it is important to form the protected clusters of CNT's on the backside of the wafer, prior to the formation of any heat sensitive materials, including but not limited to metallization layers, on the front side of the wafer. However, highest temperature front side processing that would not be affected by CNT formation temperatures may be completed before the formation of the protected CNT clusters.

Figure 7:
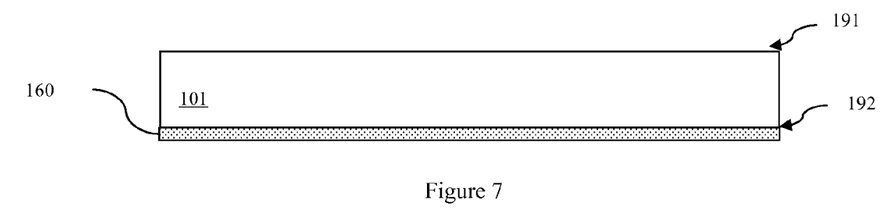
FIG. 7 is a cross-section diagram illustrating a partially completed semiconductor wafer structure 100 of FIGS. 1-2.

In one embodiment of the method described in the flow diagram of FIG. 5, these protected clusters of CNTs can be formed by first forming a diffusion barrier layer 160 on the back side of the semiconductor wafer 101 (506, see also FIG. 7). This diffusion barrier layer 160 formation can be accomplished, for example, by depositing an approximately 50 nm silicon nitride layer.

Figure 8:
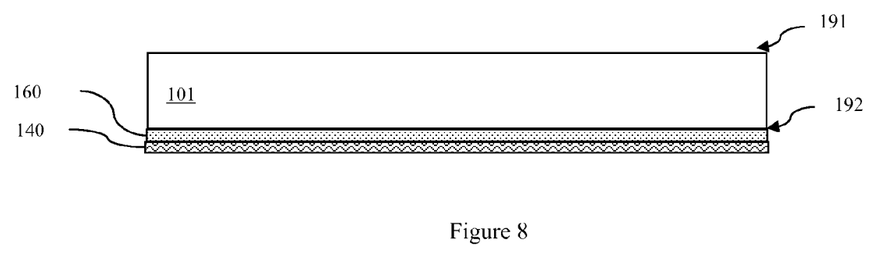
FIG. 8 is a cross-section diagram illustrating a partially completed semiconductor wafer structure 100 of FIGS. 1-2.

Next, a blanket catalyst layer 140 can be formed adjacent to the diffusion barrier layer 160 (508, see also FIG. 8). Formation of this blanket catalyst layer 140 can be accomplished, for example, by depositing an approximately 50 nm layer of cobalt (Co), nickel (Ni), iron (Fe) or any other suitable metal catalyst layer for growing CNTs.

Figure 9:
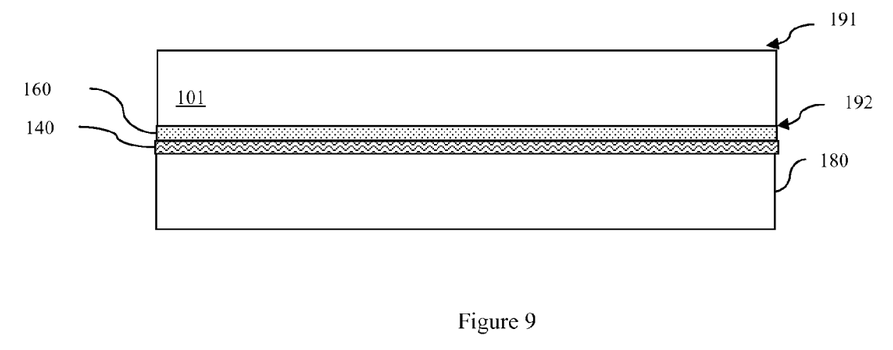
FIG. 9 is a cross-section diagram illustrating a partially completed semiconductor wafer structure 100 of FIGS. 1-2.

Then, a spacer layer 180 can be formed adjacent the catalyst layer 240 (510, see also FIG. 9). The catalyst layer 240 formation can be accomplished, for example, by depositing a chemically and mechanically stable protective film (e.g., an approximately 100 nm silicon dioxide ($SiO_2$) layer or polysilicon layer).

Figure 10:
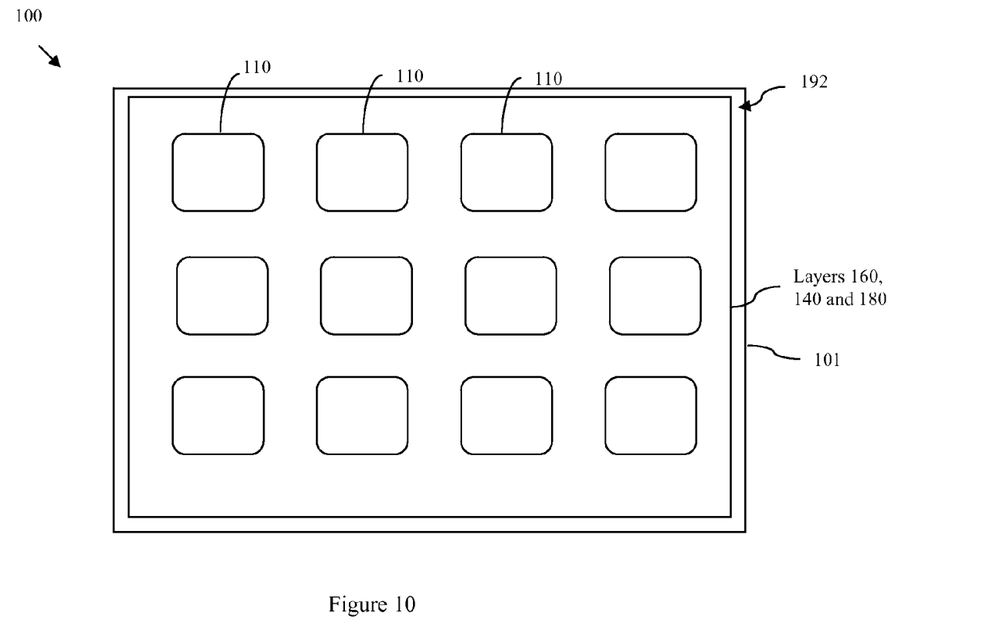
FIG. 10 is a top view diagram illustrating a partially completed semiconductor wafer structure 100 of FIGS. 1-2.
Figure 11:
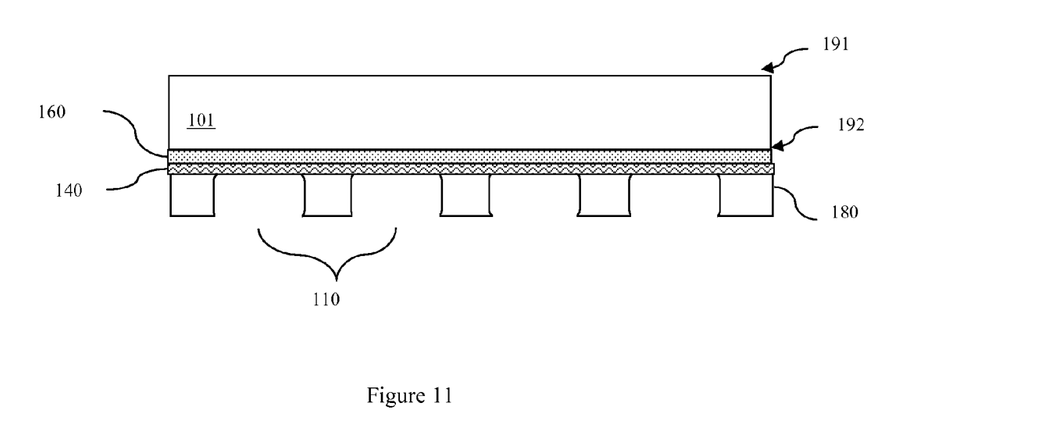
FIG. 11 is a cross-section diagram illustrating the partially completed semiconductor wafer structure of FIG. 10.

Once the spacer layer 180 is formed (at process 510 of FIG. 5), a pattern of trenches 110 can be formed in the spacer layer 180, where each trench extends through the spacer layer 180 to the catalyst layer 140 (512, see also FIGS. 10-11). Specifically, referring to the top view and cross sections diagrams of FIGS. 10 and 11 in combination, using conventional lithographic techniques, the spacer layer 180 can be configured with a pattern of trenches 110, where each trench 110 extends through the spacer layer 180 to the catalyst layer 140 such that each trench 110 comprises a through hole. The pattern of trenches 110 (including the size, shape and number of trenches) can be approximately uniform across the spacer layer 180. The pattern can, for example, comprise a "waffle" pattern in which the trenches 110 are square or rectangular in shape. Alternatively, the pattern can comprise an "egg-crate" pattern in which the trenches 110 are circular or oval in shape. The pattern can be laid out such that a predetermined percentage (e.g., approximately 50-70%) of the surface area of the catalyst layer 140 on the back side 192 of the wafer 101 is exposed. The pattern can further be laid out such that the trench 110 openings range from 0.5 to 10 microns in width and the trenches 110 are separated from each other by 0.5 to 10 micron spacer areas.

Figure 12:
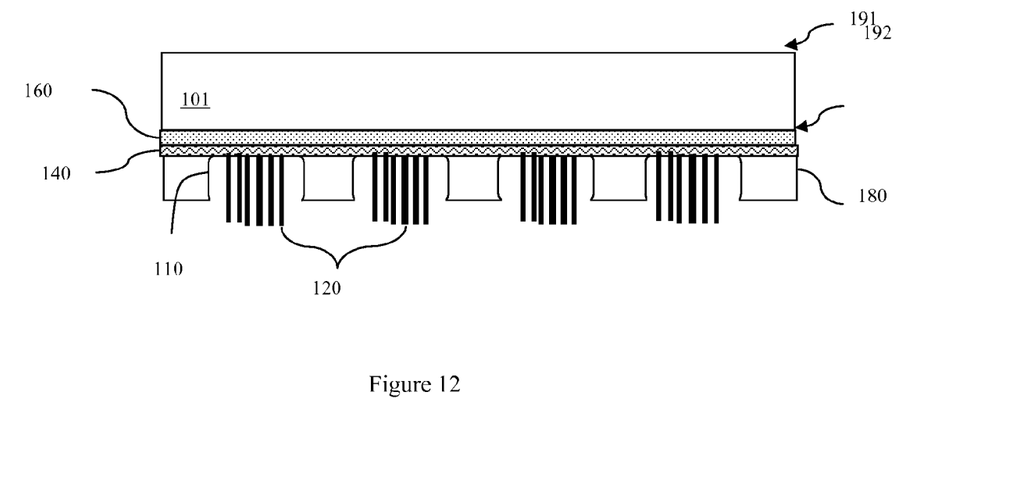
FIG. 12 is a cross-section diagram illustrating a partially completed semiconductor wafer structure 100 of FIGS. 1-2.

Then, using well-known techniques (e.g., $CO/H_2$, acetylene/ammonia, or other appropriate gasses), CNTs 120 can be grown within each of the trenches 110 and, more particularly, on the exposed portion of the catalyst layer 140 at the bottom surface of each trench 110 such that they extend beyond the surface of the spacer layer 180 (i.e., such that they extend outside each trench 110) (514, see also FIG. 12).

Figure 13:
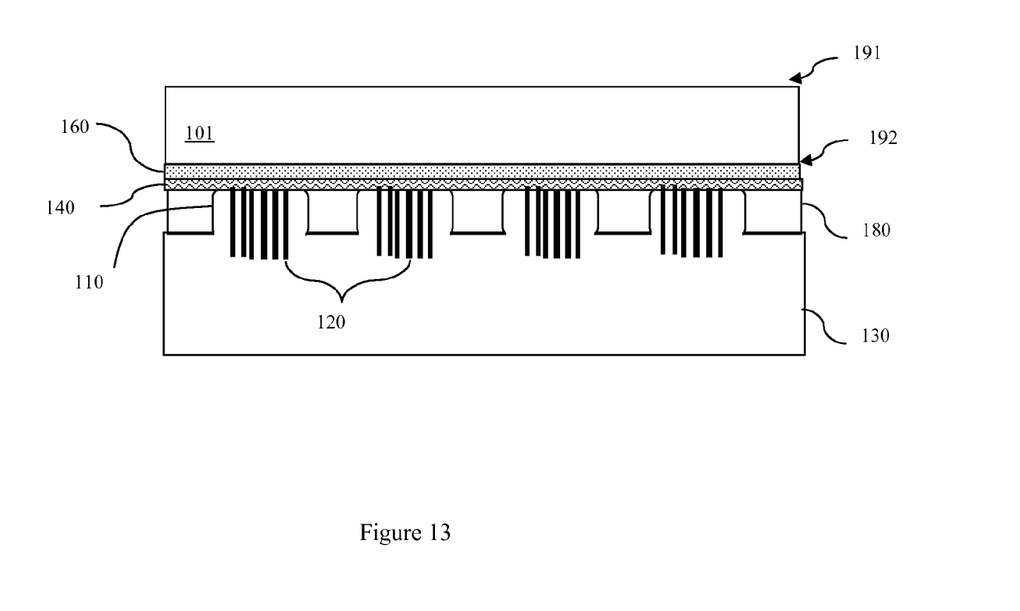
FIG. 13 is a cross-section diagram illustrating a partially completed semiconductor wafer structure 100 of FIGS. 1-2.

A fill material 130 can be deposited into each trench adjacent to (i.e., surrounding) the CNTs (516, see also FIG. 13). The fill material 130 can comprise a heat-conductive material. For example, the fill material 130 can comprise polysilicon, tungsten (W), tantalum nitride (TaN), titanium nitride (TiN), copper, diamond like carbon (DLC), amorphous carbon or any other suitable heat conductive material. It should be noted that voids may also be present within the fill material around the CNTs.

Next, a chemical mechanical polishing (CMP) process can be performed stopping on the spacer layer 180 (518). The CMP process is followed by the formation of a protective cap layer 150 on the spacer layer 180 (518-520, see also FIG. 2). Formation of the protective cap layer 150 can be accomplished by depositing a chemically and mechanically stable protective film, e.g., a polysilicon layer or a nitride layer. For example, the protective cap layer 150 can comprise an approximately 100 nm silicon nitride (SiN) layer. Thus, the resulting structure is a wafer 100 having protected cluster of CNTs 120 positioned within each one of the trenches 110 in the spacer layer 180 and covered by the protective cap layer 180.

Figure 14:
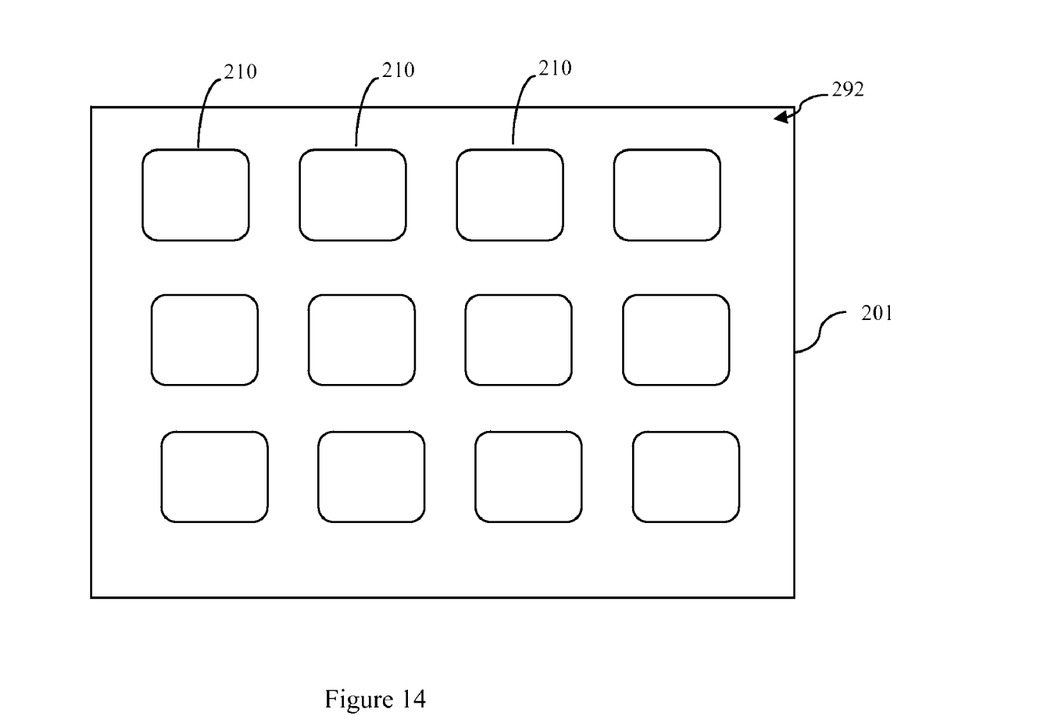
FIG. 14 is a top view diagram illustrating a partially completed semiconductor wafer structure 200 of FIGS. 3-4.
Figure 15:
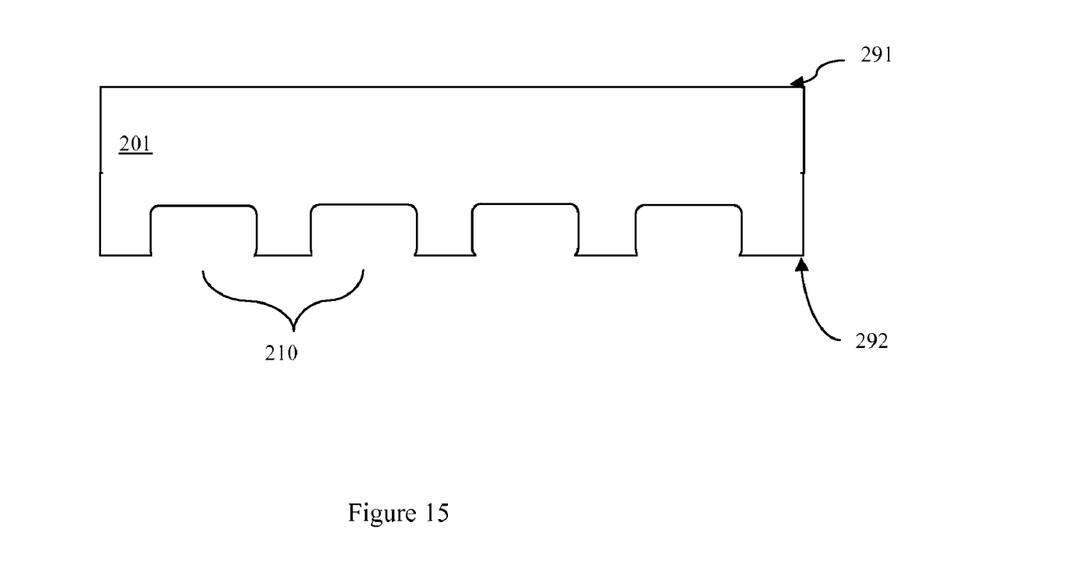
FIG. 15 is a cross-section diagram illustrating a partially completed semiconductor wafer structure 200 of FIGS. 3-4.

Alternatively, in another embodiment of the method described in the flow diagram of FIG. 5, these protected clusters of CNTs can be formed by forming a pattern of trenches 210 in the back side 292 of the semiconductor wafer 201 itself (522, see also FIGS. 14-15). The pattern of trenches 210 can be formed, for example, using conventional lithographic techniques. The pattern of trenches 210 (including the size, shape and number of trenches) can be formed such that the trenches 210 are approximately uniform across the back side 292 of the wafer 201. The pattern can, for example, comprise a "waffle" pattern in which the trenches 210 are square or rectangular in shape. Alternatively, the pattern can comprise an "egg-crate" pattern in which the trenches 210 are circular or oval in shape. The trenches can be etched such that their depth ranges, for example, between 100 and 300 μm.

Additionally, the pattern can be laid out such that a predetermined percentage (e.g., approximately 50-70%) of the back side 292 of the wafer 101 is trenched out. The pattern can further be laid out such that the trench 210 openings range from 0.5 to 10 microns in width and the trenches 210 are separated from each other by 0.5 to 10 microns of wafer substrate.

Figure 16:
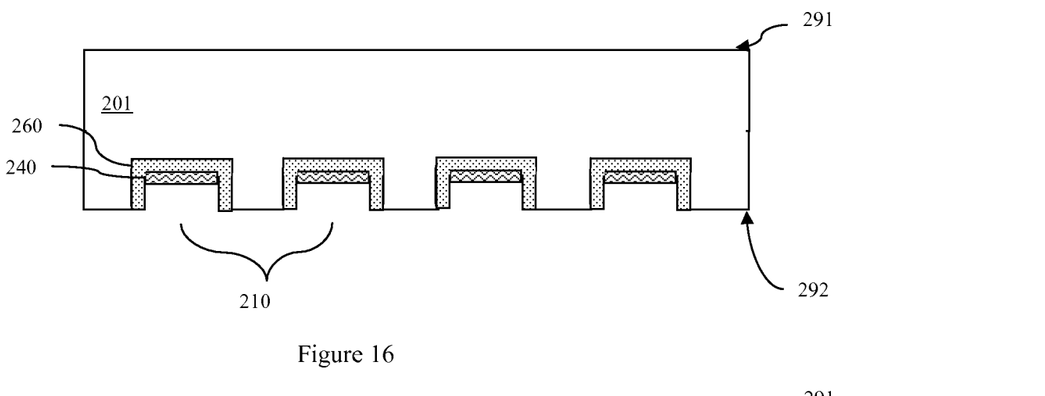
FIG. 16 is a cross-section diagram illustrating a partially completed semiconductor wafer structure 200 of FIGS. 3-4.

Then, a diffusion barrier layer 260 can be formed on the bottom surface of each trench 210 followed by a catalyst layer 240 (524-526, see also FIG. 16). The diffusion barrier layer 260 can be formed, for example, by depositing and then etching back a nitride layer. A metal catalyst layer 240 (e.g., a cobalt (Co), nickel (Ni), iron (Fe) or any other suitable metal catalyst layer) can be formed in each trench by various alternative methods. For example, the trenches 210 can be filled with the metal catalyst material and then the material can be recessed using a wet or dry etch process. Alternatively, a lift-off lithographic step can be performed, patterning an opening in a resist layer over the trench, followed by sputtering the metal catalyst material into the opening. Once the metal catalyst material is sputtered into the trench, the resist layer can be removed.

Figure 17:
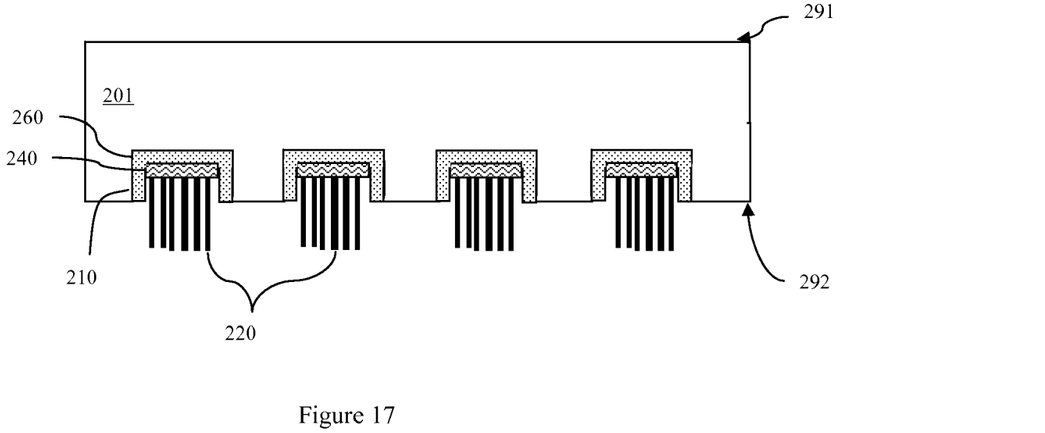
FIG. 17 is a cross-section diagram illustrating a partially completed semiconductor wafer structure 200 of FIGS. 3-4.

Next, using well-known techniques (e.g., CO/H2, acetylene/ammonia, or other appropriate gasses), CNTs 220 can be grown within each of the trenches 210 on the catalyst layer 240 such that they extend beyond the back side 292 surface of the wafer 201 (i.e., such that they extend outside the top of each trench) (528, see also FIG. 17).

Figure 18:
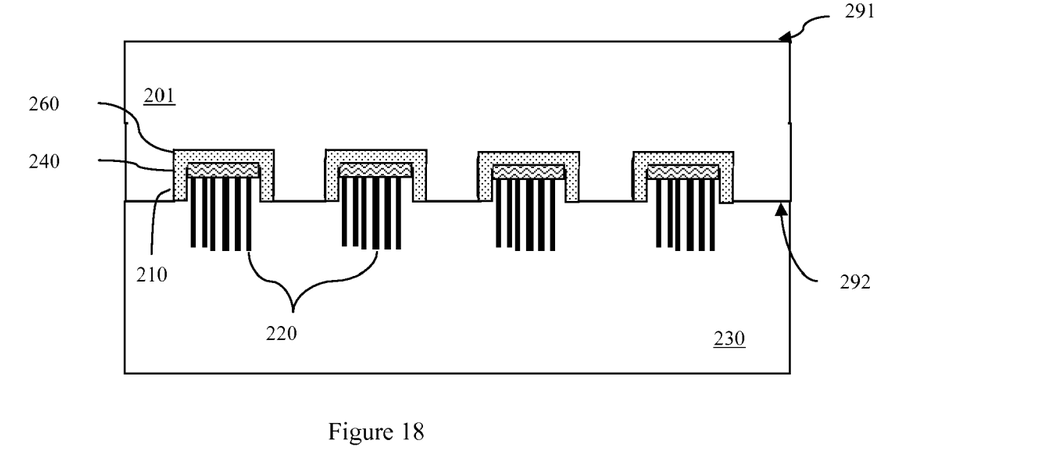
FIG. 18 is a cross-section diagram illustrating a partially completed semiconductor wafer structure 200 of FIGS. 3-4.

A fill material 230 can be deposited into each trench 210 adjacent to (i.e., surrounding) the CNTs 220 (530, see also FIG. 18). The fill material 230 can comprise a heat-conductive material. For example, the fill material 230 can comprise polysilicon, tungsten (W), tantalum nitride (TaN), titanium nitride (TiN), copper, diamond like carbon (DLC), amorphous carbon or any other suitable heat conductive material. It should be noted that voids may also be present within the fill material around the CNTs.

Next, a chemical mechanical polishing (CMP) process can be performed stopping on the back side 292 surface of the wafer 201 (at the top of the trenches 210) (532). CMP can be followed by formation of a protective cap layer 250 adjacent to the back side 292 of the semiconductor wafer 201 (534, see also FIG. 4). Formation of the protective cap layer 250 can be accomplished by depositing a chemically and mechanically stable protective film, e.g., a polysilicon layer or a nitride layer. For example, the protective cap layer 150 can comprise an approximately 100 nm silicon nitride ($Si_3N_4$) layer. Thus, the resulting structure is a wafer 200 having protected cluster of CNTs 220 positioned within each one of the trenches 210 in the spacer layer 280 and covered by the protective cap layer 280.

Referring to FIGS. 19a-b, 20a-b and 21a-b, also disclosed are embodiments of a semiconductor module 1900a-b, 2000a-b and 2100a-b. It should be noted that semiconductor module embodiments 1900a, 2000a and 2100a are formed using a chip that is diced from the wafer structure 100, described above in detail and illustrated in FIGS. 1-2. Similarly, the semiconductor module embodiments 1900b, 2000b, and 2100b are formed using a chip that is diced from the wafer structure 200, described above in detail and illustrated in FIGS. 3-4.

Figure 19A:
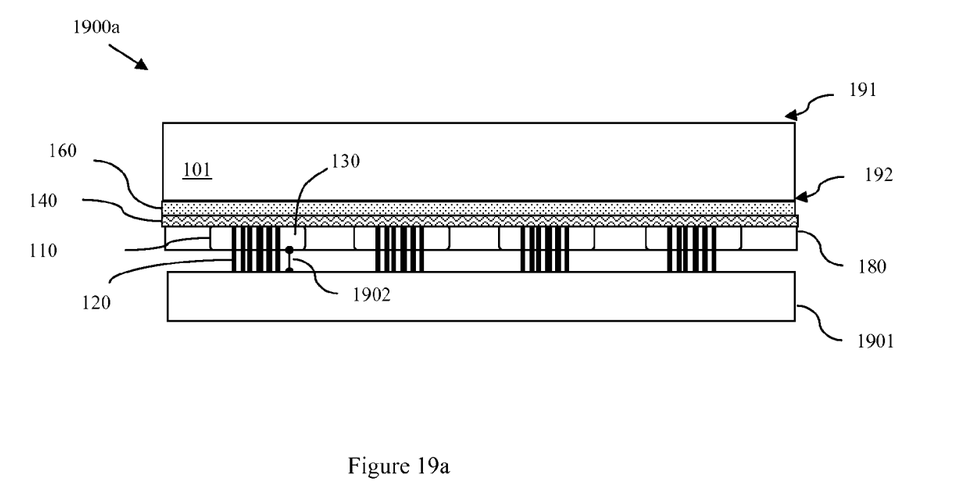
FIGS. 19a-b are cross-section diagrams illustrating alternative configurations for a semiconductor module 1900a-b.
Figure 19B:
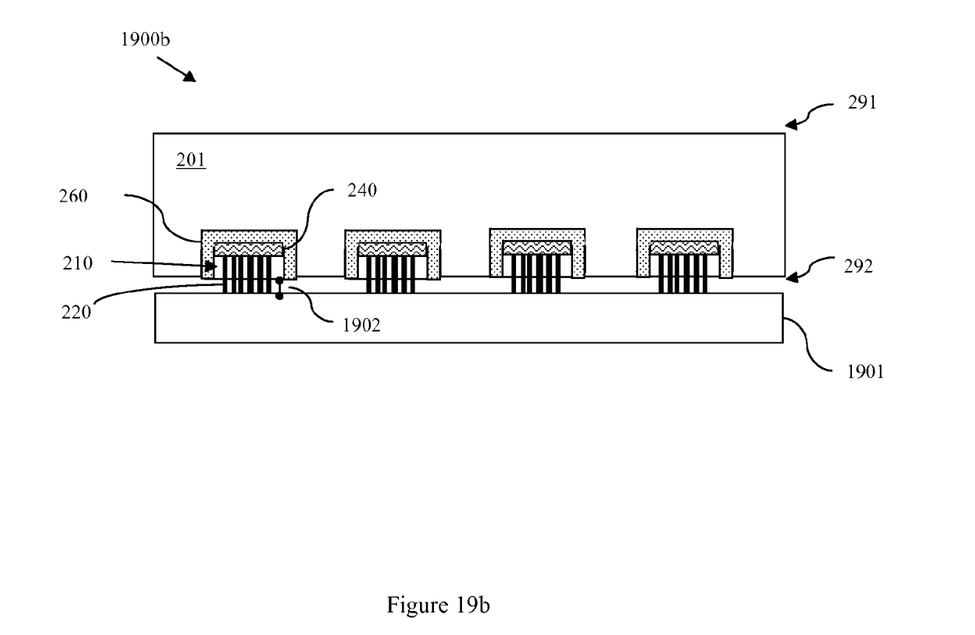
Figure 20A:
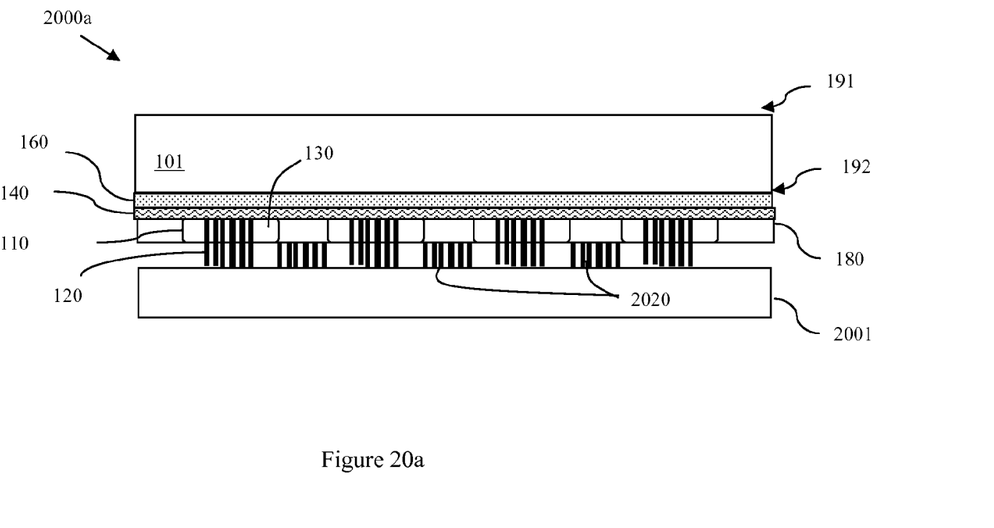
FIGS. 20a-b are cross-section diagrams illustrating alternative configurations for a semiconductor module 2000a-b.
Figure 20B:
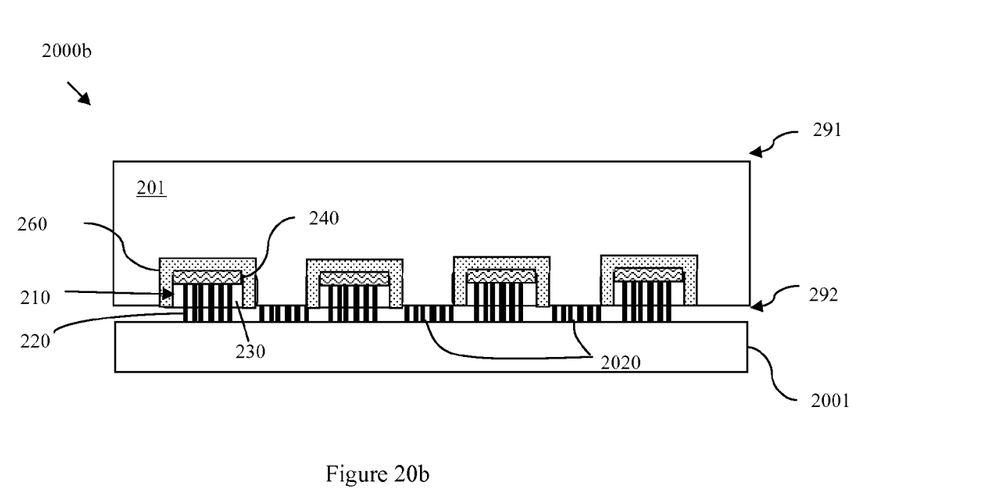
Figure 21A:
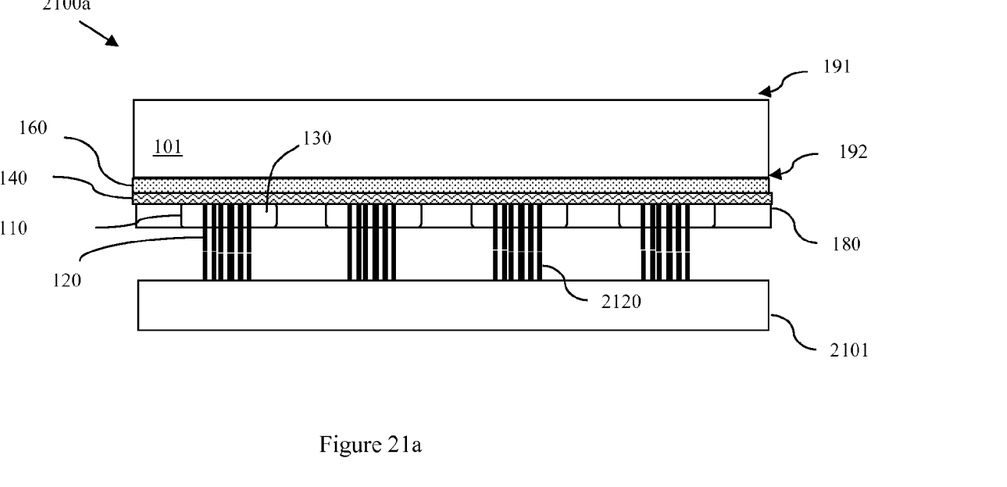
FIGS. 21a-b are cross-section diagrams illustrating alternative configurations for a semiconductor module 2100a-b.
Figure 21B:
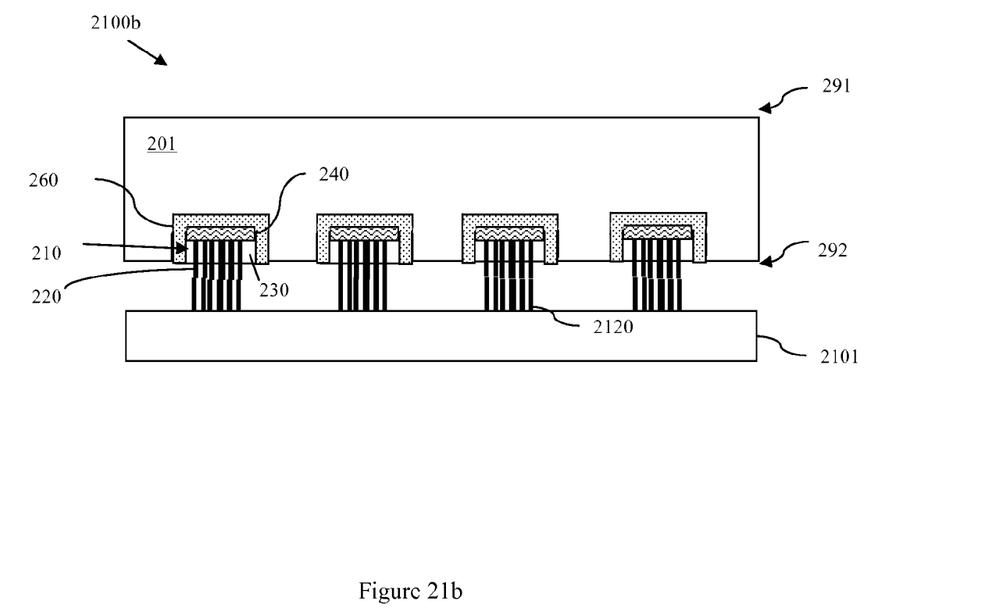

Each of the semiconductor modules 1900a-b, 2000a-b and 2100a-b comprises a chip substrate 101, 201 having a back side 192, 292, and a front side 191, 291 opposite the back side. The semiconductor modules 1900a-b, 2000a-b and 2100a-b can each further comprise at least one semiconductor device on the front side 191, 291 of the substrate 101, 201. On the back side 192, 292 of the chip, either in the substrate 201 itself (as illustrated in FIGS. 19b, 20b and 21b) or on a spacer layer 180 adjacent to the substrate 101 (as illustrated in FIGS. 19a, 20a and 21a), the semiconductor module can comprise a plurality of trenches 110, 210 and a plurality of clusters of carbon nanotubes (CNTs) 120, 220 within those trenches. That is, one cluster of CNTs 120, 220 can be positioned within each one of the trenches 110, 210. The trenches 110, 210 can further be filled with a fill material 130, 230 such that the fill material is adjacent to (i.e., surrounding) the clusters.

A heat sink (see heat sink 1901 of FIGS. 19a-b, heat sink 2001 of FIGS. 20a-b and heat sink 2101 of FIGS. 21a-b) can be attached to the back side 192, 292 of the chip substrate 101, 201 such that it is in contact with each of the clusters of CNTs 120, 220 in order to enhance thermal dissipation. It should be noted that the CNTs 120, 220 can extend outside of the trenches 110, 210 (e.g., by a predetermined amount 1902, as illustrated in FIGS. 19a-b) so as to allow a flexible connection with the heat sink.

Referring specifically to FIGS. 19a-b, in one embodiment of the semiconductor module 1900a-b, the heat sink 1901 can have a smooth surface that is in contact with each of the clusters of CNTs 120, 220.

Referring to FIGS. 20a-b in another embodiment of the semiconductor module 2000a-b, the heat sink 2001 can comprise a surface from which additional clusters of CNTs 2020 extend. The additional clusters of CNTs 2020 can be positioned such that they are offset from the clusters of CNTs 120, 220 on the back side of the chip substrate 101, 201. Thus, when the heat sink 2001 is attached to the substrate 101, 201, the clusters of CNTs 120, 220 on the chip substrate 101, 201 will contact the heat sink 2001 surface and the additional clusters of CNTs 2020 on the heat sink 2001 will similarly contact the chip substrate 101, 201.

Referring to FIGS. 21a-b in yet another embodiment of the semiconductor module 2100a-b, the heat sink 2101 can similarly comprise a surface from which additional clusters of CNTs 2120 extend. However, in this embodiment, the additional clusters of CNTs 2120 can be positioned directly opposite the clusters of CNTs 120, 220 on the chip substrate 101, 201. These additional clusters of CNTs 2120 on the heat sink 2101 can be chemically bound to the clusters of CNTs 120, 220 on the chip substrate 101, 201, thereby, providing the contact to the heat sink 2101.

Figure 22:
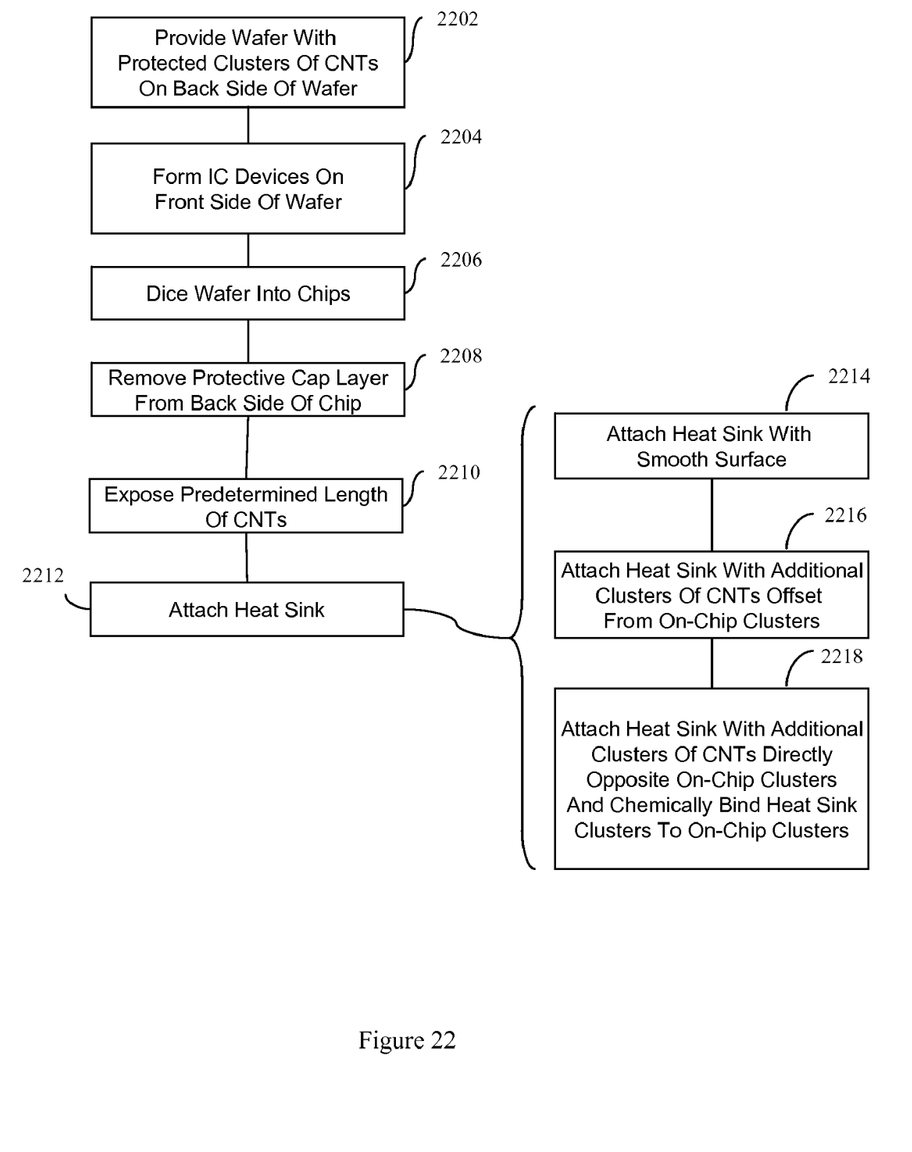
FIG. 22 is a flow diagram illustrating embodiments of a method of forming the semiconductor module embodiments of FIGS. 19a-b, 20a-b, and 21a-b.

Referring to the FIG. 22, also disclosed are embodiments of a method of forming the above-described semiconductor module embodiments using the above described semiconductor wafer embodiments. The method embodiments comprise providing a semiconductor wafer, such as wafer 100 illustrated above in FIG. 1 or wafer 200 illustrated above in FIG. 3, having a back side 192, 292 with a plurality of protected clusters of carbon nanotubes (CNTs) 120, 220 (2202). The clusters of CNTs 120, 220 can be positioned within trenches 210 in the back side 292 of the semiconductor wafer 200 itself (see FIG. 3) or within trenches 110 in a spacer layer 180 on the back side 192 of the semiconductor wafer 100 (see FIG. 1). These clusters of CNTs 120, 220 can be protected during processing of devices on front side 191, 291 by a protective cap layer 150, 250 over the trenches 110, 210.

Next, integrated circuit devices, including semiconductor devices, metallization layers, etc., can be formed on the front side 191, 291 of the semiconductor wafer 100, 200 using conventional processing techniques (2204). Then, the wafer 100, 200 can be divided into (i.e., diced into) chips such that each chip retains at least one cluster of CNTs 120, 220 (2206). Once the wafer 100, 200 is diced into chips, the protective cap layer 150, 250 can be removed from a chip (2208), thereby, exposing one end of the CNTs as well as any fill material in the trenches 110, 210.

Then, a heat sink can be attached to the chip such that the carbon nanotube (CNT) clusters on the back side of the chip are in contact with the heat sink (2212). Optionally, prior to attaching the heat sink (at process 2212), a predetermined length of the CNTs on the back side of each chip can be exposed (using a multi-step recessing process) to allow a flexible connection between the chip and heat sink (2210).

In one embodiment of the method, the process 2212 of attaching a heat sink to the chip can comprise providing a heat sink 1901 with a smooth surface and then positioning the heat sink adjacent to the back side 192, 292 of the chip such that the smooth surface of the heat sink 1901 is in contact with each of the clusters of CNTs 120, 220 on the back of the chip (2214, see FIGS. 19a and 19b).

In another embodiment of the method, the process of attaching a heat sink to the chip can comprise providing a heat sink 2001 having a surface with additional clusters of CNTs 2020 (2216, see FIGS. 20a-b). This heat sink 2001 can be attached to the back side 192, 292 of the chip substrate 101, 201 such that the additional clusters of CNTs 2020 on the heat sink 2001 are offset from the clusters of CNTs 120, 220 on the chip. Thus, when the heat sink 2001 is attached to the chip substrate 101, 201, the clusters of CNTs 120, 220 on the chip substrate 101, 201 will contact the heat sink surface and the additional clusters of CNTs 2020 on the heat sink 2001 will similarly contact the chip substrate 101, 201.

In yet another embodiment of the method, the process of attaching a heat sink 2101 to the chip can similarly comprise providing a heat sink 2101 having a surface with additional clusters of CNTs 2120 (2218, see FIGS. 21a-b). However, in this embodiment the heat sink 2101 can be attached to the chip substrate 101, 201 such that the additional clusters of CNTs 2120 on the heat sink 2101 are positioned directly opposite the clusters of CNTs 120, 220 on the chip. Then, the additional clusters of CNTs 2120 on the heat sink 2101 can be chemically bound to the clusters of carbon nanotubes (CNT) 120, 220 on the chip substrate 101, 201, thereby providing the contact to the heat sink 2101. Conventional processing techniques can be used to chemically bond the on-chip and heat sink CNTs. For example, one set of carbon nanotube clusters (e.g., the on-chip clusters 120, 220) could be treated with ammonia plasma and the other set of carbon nanotube clusters (e.g., the heat sink clusters 2120) can be treated with maleic anhydride plasma. The CNTs treated with the ammonia plasma will become aminated and will react with the maleic anhydride on the opposite to create a chemical linkage.

Therefore, disclosed above are embodiments of an improved semiconductor wafer structure having protected clusters of carbon nanotubes (CNTs) on the back surface and a method of forming the improved semiconductor wafer structure. Also disclosed are embodiments of a semiconductor module with exposed CNTs on the back surface for providing enhanced thermal dissipation in conjunction with a heat sink and a method of forming the semiconductor module using the disclosed semiconductor wafer structure. With improved thermal conductivity between chip and heat sink, power consumption of the chip can be tolerated without excessive heating possibly contributing to chip failure.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the invention has been described in terms of embodiments, those skilled in the art will recognize that these embodiments can be practiced with modification within the spirit and scope of the appended claims.

What is claimed is:

1. A semiconductor wafer structure configured with heat dissipating carbon nanotubes prior to semiconductor device and metallization layer formation, said semiconductor wafer structure comprising:
   a semiconductor wafer having a back side and a front side opposite said back side;
   a plurality of clusters of carbon nanotubes within trenches on said back side, each cluster of carbon nanotubes being contained with a corresponding trench; and
   a dielectric protective cap layer on said back side covering all of said trenches,
      said trenches and said dielectric protective cap layer protecting said clusters of carbon nanotubes during subsequent formation, on said front side, of semiconductor devices and metallization layers for discrete integrated circuit chips, and
      said clusters of carbon nanotubes being adapted to provide enhanced thermal dissipation during subsequent operation of said discrete integrated circuit chips.

2. The semiconductor wafer structure according to claim 1, further comprising:
   a diffusion barrier layer immediately adjacent to and covering said semiconductor wafer on said back side;
   a blanket catalyst layer immediately adjacent to and covering said diffusion barrier layer; and
   a spacer layer adjacent to said catalyst layer,
   said trenches extending vertically through said spacer layer to said blanket catalyst layer, each one of said trenches containing a single protected cluster of carbon nanotubes adjacent to a portion of said blanket catalyst layer at a bottom surface of said one of said trenches, and
   said dielectric protective cap layer being immediately adjacent to said spacer layer such that all of said trenches are capped.

3. The semiconductor wafer structure according to claim 2, said spacer layer comprising any one of a polysilicon layer and an oxide layer.

4. The semiconductor wafer structure according to claim 1, said trenches extending vertically into said semiconductor wafer on said back side,
   said structure further comprising:
      diffusion barrier layers lining said trenches; and
      catalyst layers on horizontal surfaces only of said diffusion barrier layers in said trenches, each one of said trenches further containing a single protected cluster of carbon nanotubes adjacent to a catalyst layer within said one of said trenches, and
   said dielectric protective cap layer being immediately adjacent to said semiconductor wafer on said back side such that all of said trenches are capped.

5. The semiconductor wafer structure according to claim 1, said dielectric protective cap layer comprising any one of a polysilicon layer and a nitride layer.

6. The semiconductor wafer structure according to claim 1, said trenches each being filled with a thermally conductive fill material such that each carbon nanotube within said protected cluster of carbon nanotubes is laterally surrounded by said thermally conductive fill material.

7. The semiconductor wafer structure according to claim 6, said thermally conductive fill material comprising any of polysilicon, tungsten, tantalum nitride, titanium nitride, copper, diamond like carbon (DLC) and amorphous carbon.

8. The semiconductor wafer structure according to claim 1, said trench being any one of square, oval and circular in shape.

9. The semiconductor wafer structure according to claim 1, said trenches and, thereby said clusters of carbon nanotubes being approximately evenly distributed across said back side in any one of a waffle pattern and an egg-crate pattern.

10. A semiconductor wafer structure configured with heat dissipating carbon nanotubes prior to semiconductor device and metallization layer formation, said semiconductor wafer structure comprising:
    a semiconductor wafer having a back side and a front side opposite said back side;
    a diffusion barrier layer immediately adjacent to and covering said semiconductor wafer on said back side;
    a blanket catalyst layer immediately adjacent to and covering said diffusion barrier layer;
    a spacer layer adjacent to said catalyst layer;
    trenches extending vertically through said spacer layer to said blanket catalyst layer;
    a plurality of clusters of carbon nanotubes within said trenches, each one of said trenches containing a single protected cluster of carbon nanotubes adjacent to a portion of said blanket catalyst layer at a bottom surface of said one of said trenches; and
    a dielectric protective cap layer immediately adjacent to said spacer layer and covering all of said trenches,
       said trenches and said dielectric protective cap layer protecting said clusters of carbon nanotubes during subsequent formation, on said front side, of semiconductor devices and metallization layers for discrete integrated circuit chips, and
       said clusters of carbon nanotubes being adapted to provide enhanced thermal dissipation during subsequent operation of said discrete integrated circuit chips.

11. The semiconductor wafer structure according to claim 10, said dielectric protective cap layer comprising any one of a polysilicon layer and nitride layer and said spacer layer comprising any one of another polysilicon layer and an oxide layer.

12. The semiconductor wafer structure according to claim 11, said trenches and, thereby said clusters of carbon nanotubes being approximately evenly distributed throughout said spacer layer in any one of a waffle pattern and an egg-crate pattern.

13. The semiconductor wafer structure according to claim 10, said trenches each further being filled with a fill material such that each carbon nanotube within said single protected cluster of carbon nanotubes is laterally surrounded by said fill material, said fill material comprising a thermally conductive fill material comprising any of polysilicon, tungsten, tantalum nitride, titanium nitride, copper, diamond like carbon (DLC) and amorphous carbon.

14. The semiconductor wafer structure according to claim 10, said trenches being any one of square, oval and circular in shape.

15. A semiconductor wafer structure configured with heat dissipating carbon nanotubes prior to semiconductor device and metallization layer formation, said semiconductor wafer structure comprising:

a semiconductor wafer having a back side and a front side opposite said back side;
trenches extending vertically into said semiconductor wafer on said back side;
diffusion barrier layers lining said trenches;
catalyst layers on horizontal surfaces only of said diffusion barrier layers;
a plurality of clusters of carbon nanotubes within said trenches, each one of said trenches containing a single protected cluster of carbon nanotubes adjacent to a catalyst layer within said one of said trenches; and
a dielectric protective cap layer immediately adjacent to said semiconductor wafer on said back side and covering all of said trenches,
    said trenches and said dielectric protective cap layer protecting said clusters of carbon nanotubes during subsequent formation, on said front side, of semiconductor devices and metallization layers for discrete integrated circuit chips, and
    said clusters of carbon nanotubes being adapted to provide enhanced thermal dissipation during subsequent operation of said discrete integrated circuit chips.

16. The semiconductor wafer structure according to claim 15, said dielectric protective cap layer comprising any one of a polysilicon layer and nitride layer.

17. The semiconductor wafer structure according to claim 15, said trenches and, thereby said clusters of carbon nanotubes being approximately evenly distributed throughout said back side of said semiconductor wafer in any one of a waffle pattern and an egg-crate pattern.

18. The semiconductor wafer structure according to claim 15, said trenches each further being filled with a fill material such that each carbon nanotube within said single protected cluster of carbon nanotubes is laterally surrounded by said fill material, said fill material comprising a thermally conductive fill material comprising any of polysilicon, tungsten, tantalum nitride, titanium nitride, copper, diamond like carbon (DLC) and amorphous carbon.

19. The semiconductor wafer structure according to claim 15, said trenches being any one of square, oval and circular in shape.

* * * * *